(12) United States Patent
Furukawa et al.

(10) Patent No.: US 7,492,046 B2
(45) Date of Patent: Feb. 17, 2009

(54) ELECTRIC FUSES USING CNTS (CARBON NANOTUBES)

(75) Inventors: Toshiharu Furukawa, Essex Junction, VT (US); Mark Charles Hakey, Fairfax, VT (US); Steven John Holmes, Guilderland, NY (US); David Vaclav Horak, Essex Junction, VT (US); Charles William Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 474 days.

(21) Appl. No.: 11/379,582

(22) Filed: Apr. 21, 2006

(65) Prior Publication Data

US 2007/0262450 A1    Nov. 15, 2007

(51) Int. Cl.
    *H01L 23/48* (2006.01)
(52) U.S. Cl. .............................. 257/758; 257/E23.149; 257/E23.165; 977/742
(58) Field of Classification Search .................. 257/758, 257/E23.149, E23.165; 977/742
    See application file for complete search history.

(56) References Cited

U.S. PATENT DOCUMENTS

| | | | |
|---|---|---|---|
| 6,643,165 B2 * | 11/2003 | Segal et al. ................. 365/151 |
| 7,352,607 B2 * | 4/2008 | Furukawa et al. ........... 365/151 |
| 2004/0238907 A1 | 12/2004 | Pinkerton et al. |
| 2005/0035344 A1 | 2/2005 | Bertin et al. |
| 2005/0056825 A1 | 3/2005 | Bertin et al. |
| 2005/0056877 A1 | 3/2005 | Rueckes et al. |
| 2005/0062062 A1 | 3/2005 | Bertin et al. |
| 2007/0018260 A1 * | 1/2007 | Jaiprakash et al. .......... 257/414 |
| 2007/0045667 A1 * | 3/2007 | Lieber et al. ................. 257/211 |

* cited by examiner

*Primary Examiner*—Trung Dang
(74) *Attorney, Agent, or Firm*—Schmeiser, Olsen & Watts; William D. Sabo (57) ABSTRACT

A fuse structure and a method for operating the same. The fuse structure operating method includes providing a structure. The structure includes (a) an electrically conductive layer and (b) N electrically conductive regions hanging over without touching the electrically conductive layer. N is a positive integer and N is greater than 1. The N electrically conductive regions are electrically connected together. The structure operating method further includes causing a first electrically conductive region of the N electrically conductive regions to touch the electrically conductive layer without causing the remaining N−1 electrically conductive regions to touch the electrically conductive layer.

20 Claims, 12 Drawing Sheets

ELECTRIC FUSES USING CNTS (CARBON NANOTUBES)

BACKGROUND OF THE INVENTION

1. Technical Field

The present invention relates to electric fuses, and more specifically, to electric fuses using CNTs (carbon nanotubes).

2. Related Art

Fuses are commonly employed to record information about chips and to redirect memory inquiries away from defective elements. Historically, lasers were employed to program metal fuses by blowing (melting) them. However, blown fuses cannot be un-blown and thus the information stored by the fuse structure cannot be erased. Therefore, there is a need for a fuse structure (and a method for operating the same) in which the information can be programmed more than once.

SUMMARY OF THE INVENTION

The present invention provides a structure operating method, comprising providing a structure which includes (a) an electrically conductive layer, (b) a first dielectric region and a second dielectric region on top of the electrically conductive layer, (c) N electrically conductive regions resting on the first and second dielectric regions and hanging over without touching the electrically conductive layer, wherein N is a positive integer and N is greater than 1, wherein the N electrically conductive regions are electrically connected together, wherein N electrically conductive region segments of the N electrically conductive regions have different lengths, wherein the N electrically conductive region segments are not in direct physical contact with the first and second dielectric regions and the electrically conductive layer; and causing a first electrically conductive region segment of the N electrically conductive region segments to touch the electrically conductive layer without causing the remaining N−1 electrically conductive region segments to touch the electrically conductive layer, wherein the first electrically conductive region segment is the longest electrically conductive region segment of the N electrically conductive region segments.

The present invention provides a structure operating method, comprising providing a structure which includes (a) an electrically conductive layer, (b) N electrically conductive regions hanging over without touching the electrically conductive layer, wherein N is a positive integer and N is greater than 1, wherein the N electrically conductive regions are electrically connected together; and causing a first electrically conductive region of the N electrically conductive regions to touch the electrically conductive layer without causing the remaining N−1 electrically conductive regions to touch the electrically conductive layer.

The present invention provides a semiconductor fuse structure (and a method for operating the same) in which the fuse structure can be erased and programmed more than once.

BRIEF DESCRIPTION OF THE DRAWINGS

FIGS. 1A-7D illustrate a fabrication process for forming a substrate structure, in accordance with embodiments of the present invention.

DETAILED DESCRIPTION OF THE INVENTION

FIGS. 1A-7D illustrate a fabrication process for forming a substrate structure 100, in accordance with embodiments of the present invention. More specifically, with reference to FIG. 1A, in one embodiment, the fabrication process of the substrate structure 100 starts with a conductive layer 110. In one embodiment, the conductive layer 110 can be formed on top of a semiconductor (e.g., silicon, germanium, . . . ) substrate (not shown) which is omitted for simplicity. Illustratively, the conductive layer 110 can comprise copper, aluminum, tungsten, or any other electrically conductive material.

Figure 1A:
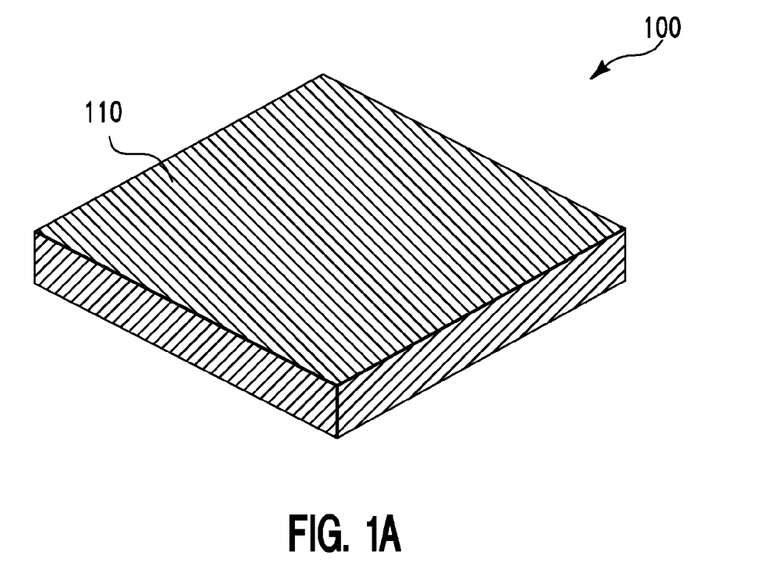
Figure 1B:
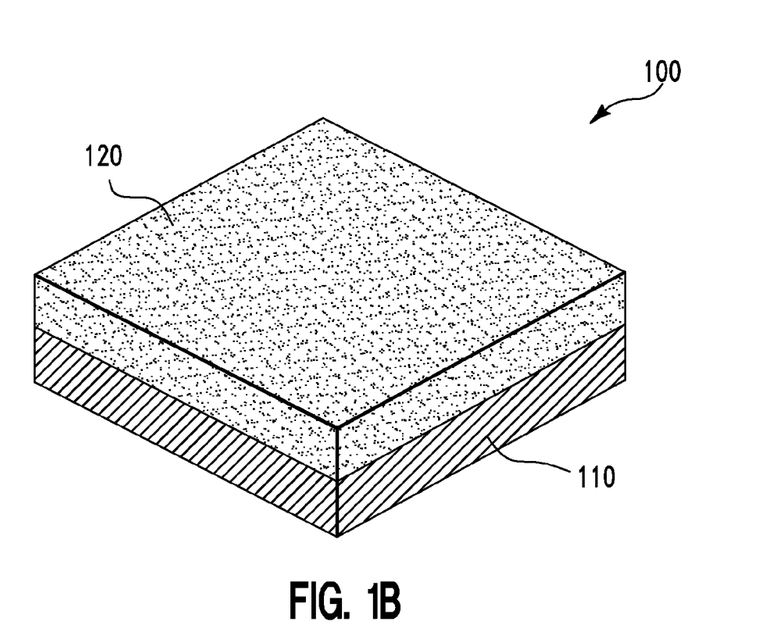

Next, with reference to FIG. 1B, in one embodiment, a dielectric layer 120 is formed on top of the conductive layer 110. Illustratively, the dielectric layer 120 comprises silicon dioxide. In one embodiment, the dielectric layer 120 can be formed by CVD (Chemical Vapor Deposition).

Figure 1C:
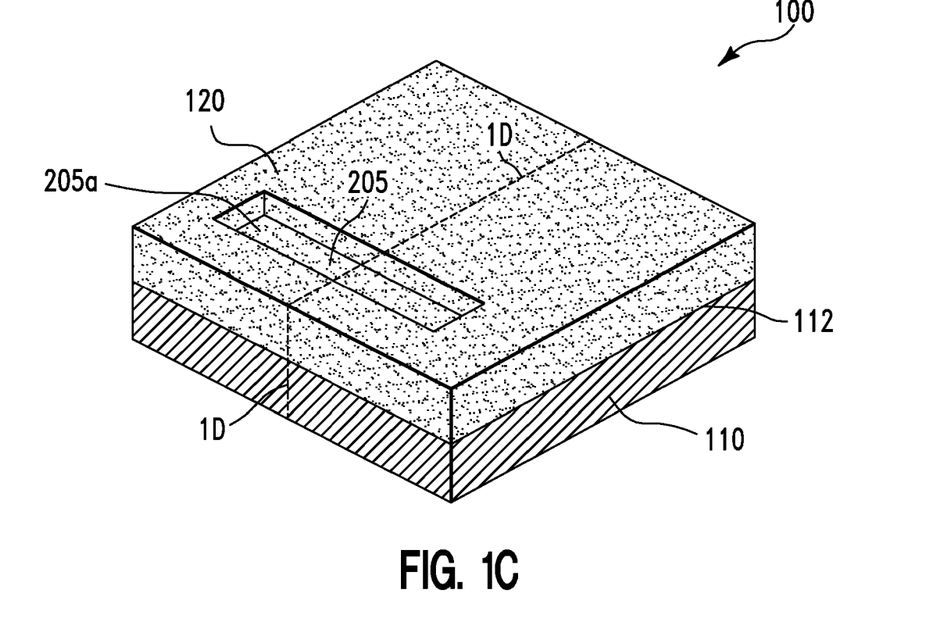

Next, with reference to FIG. 1C, in one embodiment, a trench 205 is formed in the dielectric layer 120 of the structure 100 of FIG. 1B such that a top surface 112 of the conductive layer 110 is not exposed to the surrounding ambient via the trench 205. Illustratively, the trench 205 can be formed by photo-lithography and then etching.

Figure 1D:
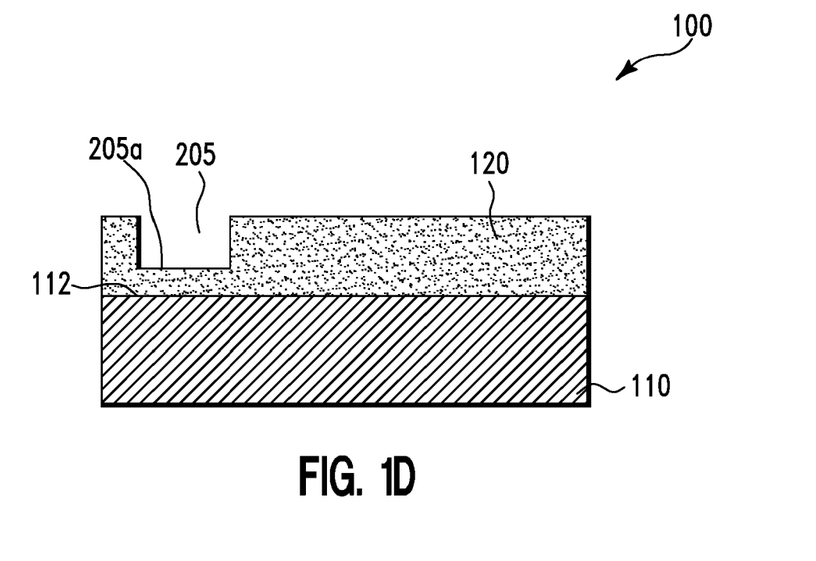

FIG. 1D illustrates a cross-section view of the structure 100 of FIG. 1C along a plane defined by a line 1D. As can be seen in FIG. 1D, the conductive layer 110 is not exposed at the bottom 205a of the trench 205.

Figure 2A:
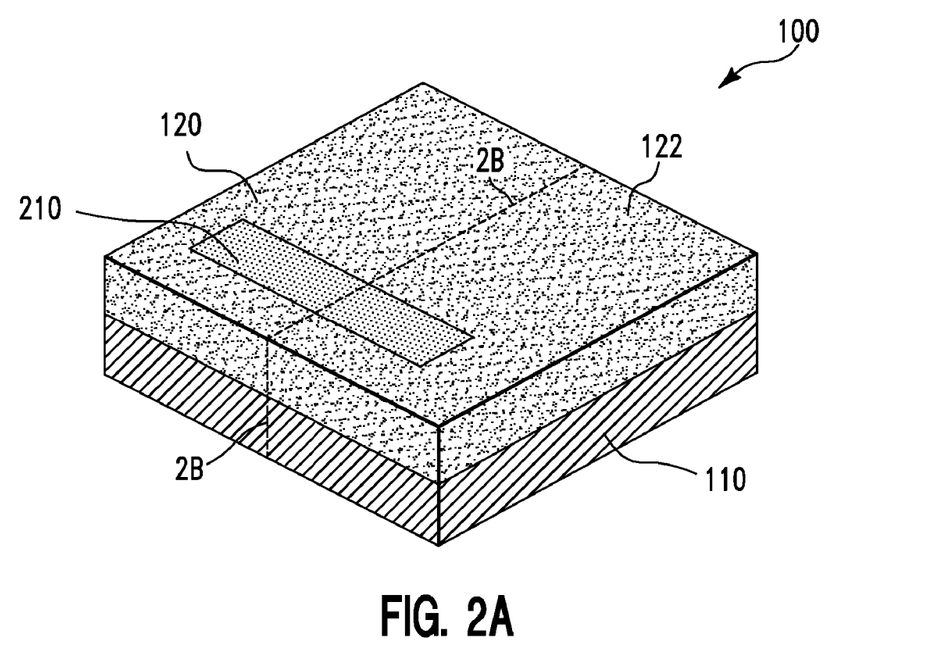

Next, with reference to FIG. 2A, in one embodiment, a catalyst region 210 is formed in the trench 205. Illustratively, the catalyst region 210 comprises iron or nickel. In one embodiment, the catalyst region 210 can be formed by CVD of iron followed by a CMP (Chemical Mechanical Polishing) step until a top surface 122 of the dielectric layer 120 is exposed to the surrounding ambient.

Figure 2B:
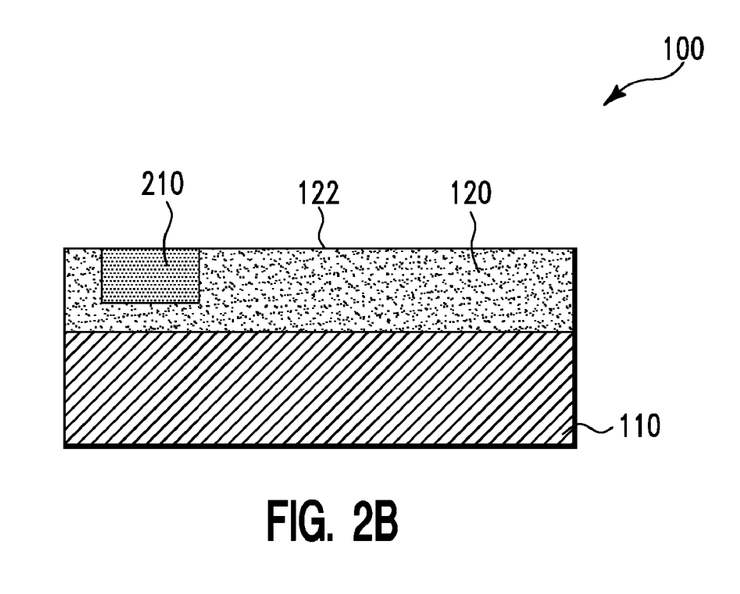

FIG. 2B illustrates a cross-section view of the structure 100 of FIG. 2A along a plane defined by a line 2B.

Figure 3A:
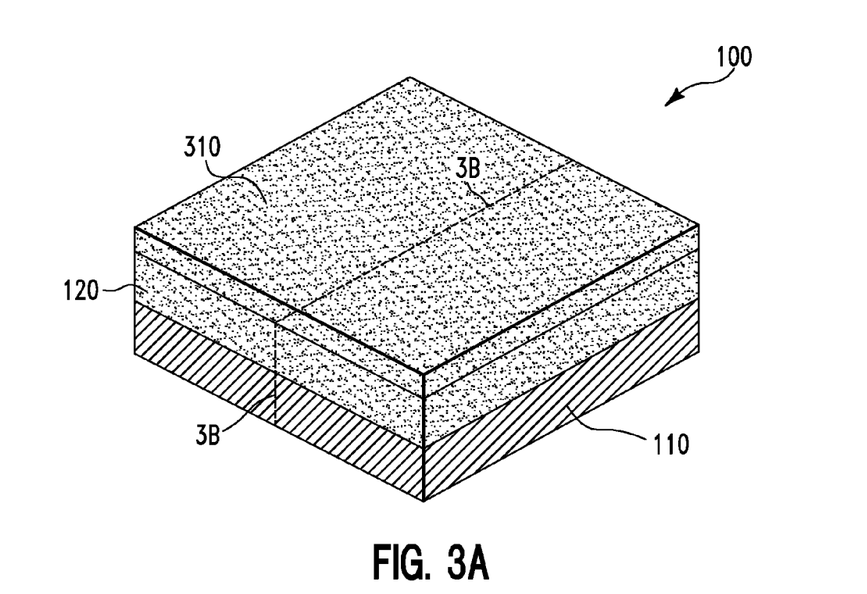

Next, with reference to FIG. 3A, in one embodiment, a dielectric layer 310 is formed on top of the structure 100 of FIG. 2A. Illustratively, the dielectric layer 310 can be formed by CVD of silicon dioxide on top of the structure 100 of FIG. 2A. It should be noted that the dielectric layer 310 and the dielectric layer 120 can be collectively referred to as a dielectric layer 120+310.

Figure 3B:
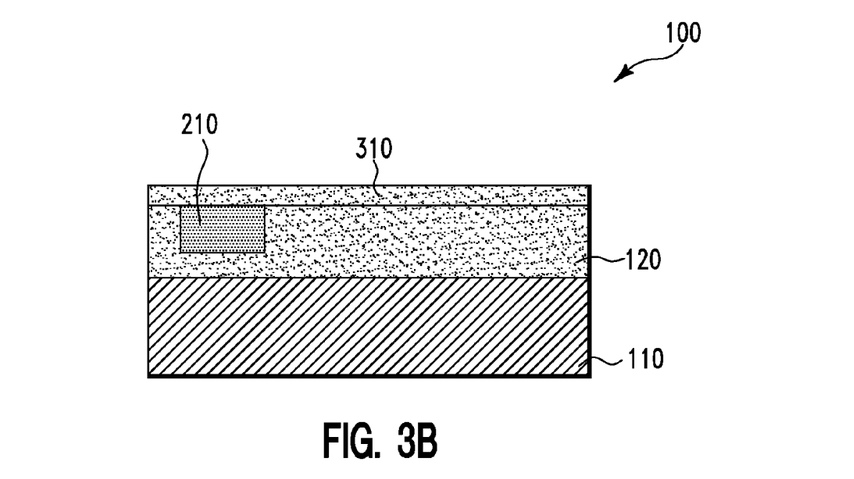

FIG. 3B illustrates a cross-section view of the structure 100 of FIG. 3A along a plane defined by a line 3B. As can be seen in FIG. 3B, the catalyst region 210 is buried inside the dielectric layer 120+310.

Figure 3C:
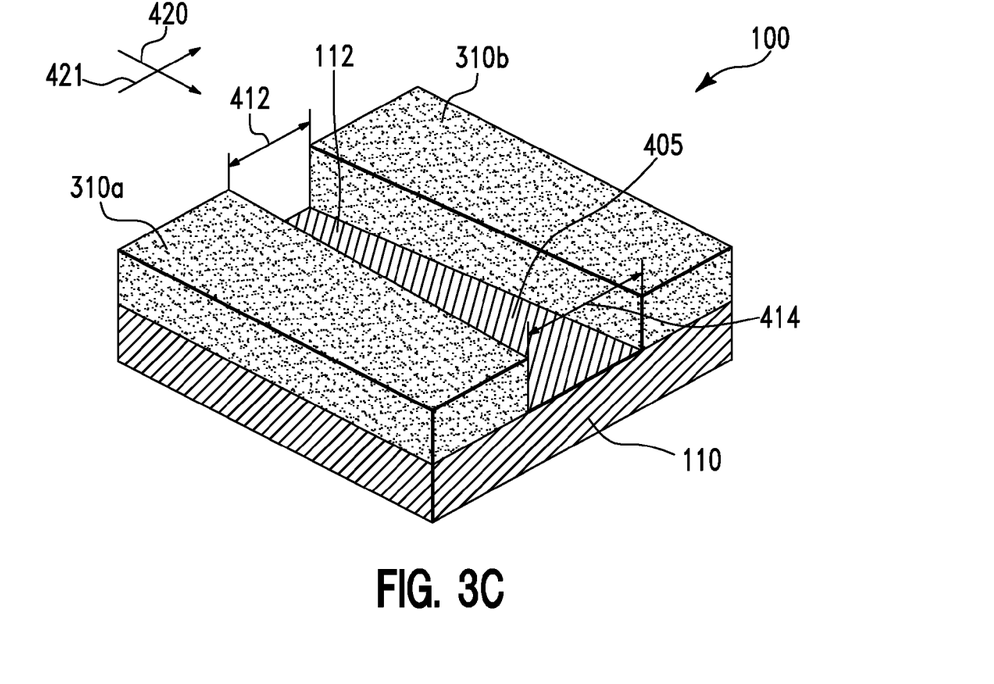

Next, with reference to FIG. 3C, in one embodiment, a trench 405 is formed in the dielectric layer 120+310 such that the top surface 112 of the conductive layer 110 is exposed to the surrounding ambient via the trench 405. More specifically, in one embodiment, when going in a direction 420, the width of the trench 405 in a direction 421 increases (wherein the direction 421 is essentially perpendicular to the direction 420). For instance, a width 412 is smaller than a width 414. In one embodiment, the trench 405 can be formed by photo-lithography and then etching. As a result of the etching the dielectric layer 120+310, what remains of the dielectric layer 120+310 is dielectric regions 310a and 310b as shown in FIG. 3C.

Figure 4A:
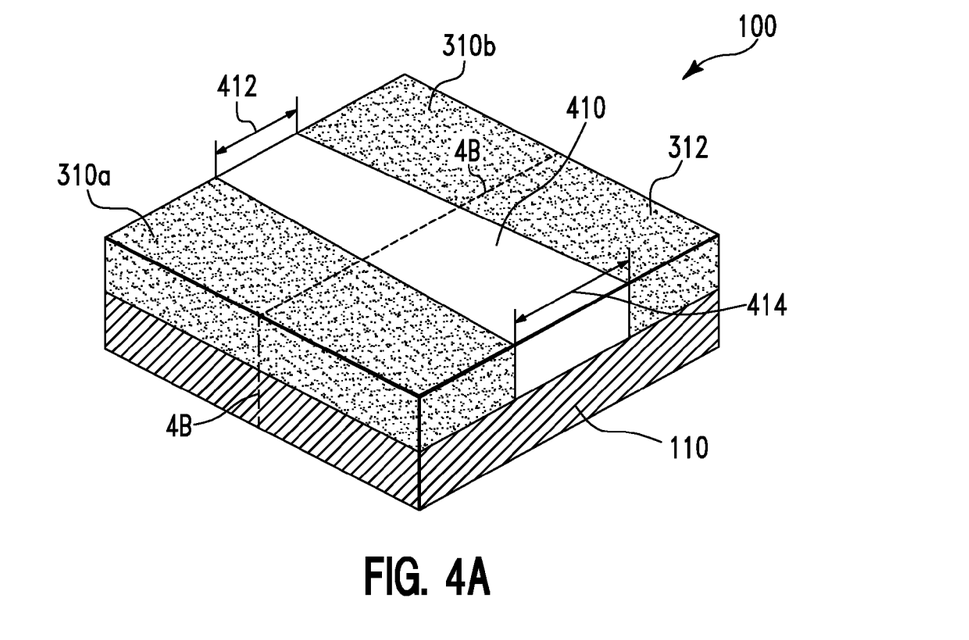

Next, with reference to FIG. 4A, in one embodiment, a sacrificial layer 410 is formed in the trench 405. Illustratively, the sacrificial layer 410 can be formed by CVD of germanium followed by a CMP step until a top surface 312 of the dielectric regions 310a and 310b is exposed to the surrounding ambient.

Figure 4B:
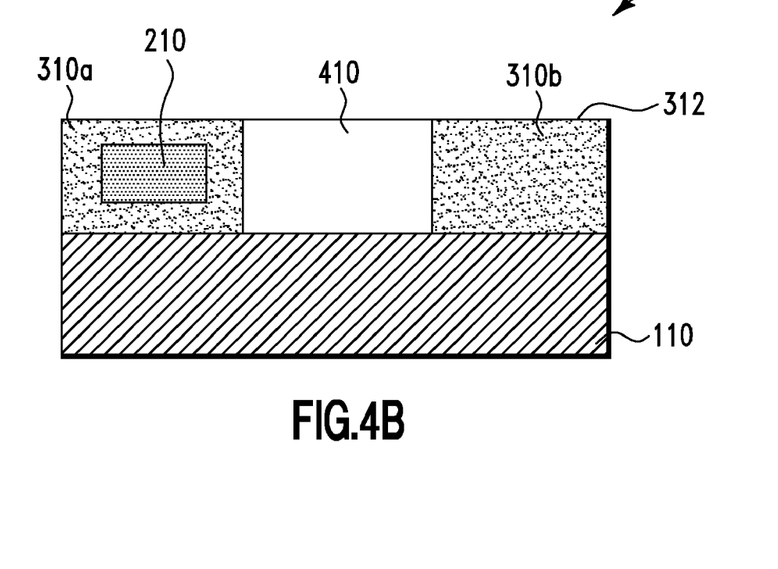

FIG. 4B illustrates a cross-section view of the structure 100 of FIG. 4A along a plane defined by a line 4B.

Figure 4C:
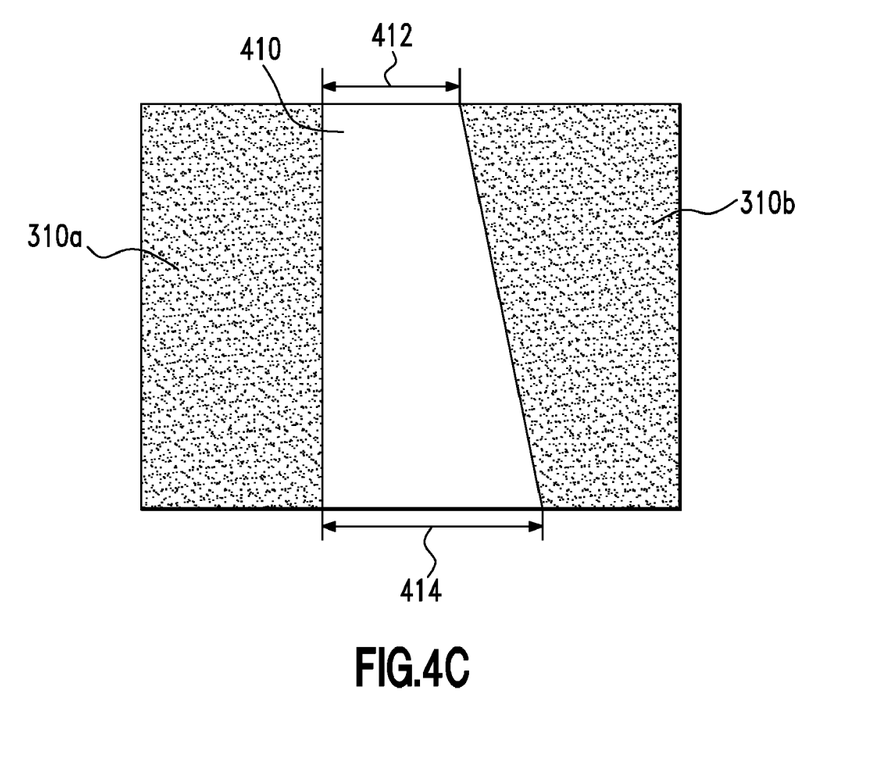

FIG. 4C illustrates a top-down view of the structure 100 of FIG. 4A.

Figure 5A:
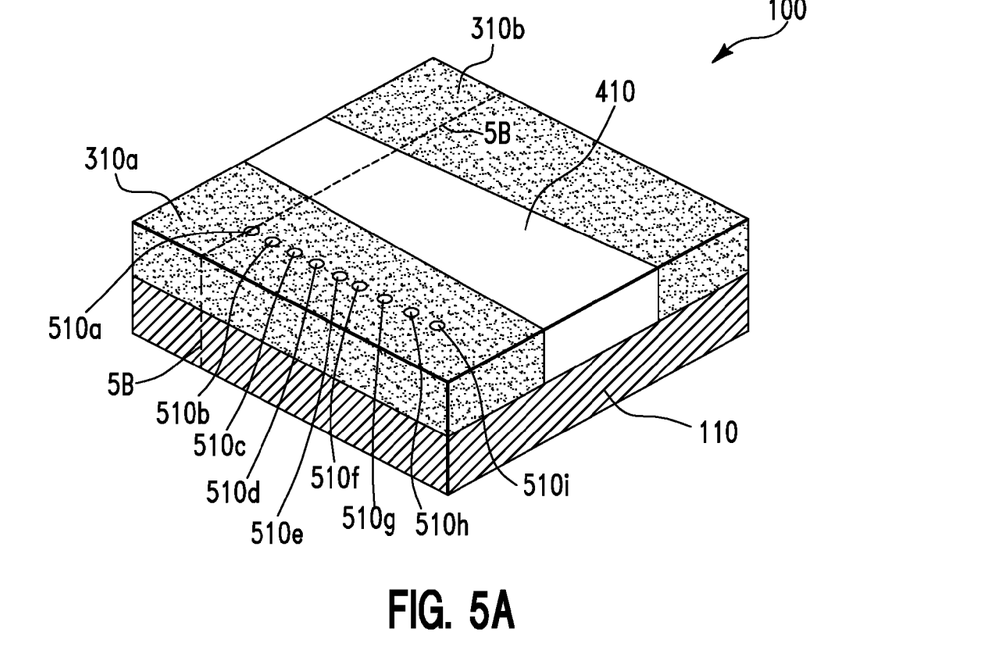

Next, with reference to FIG. 5A, in one embodiment, holes 510a-510i are formed in the dielectric region 310a. More specifically, in one embodiment, the holes 510a-510i are formed such that the catalyst region 210 is exposed to the surrounding ambient via the holes 510a-510i. In one embodiment, the holes 510a-510i can be formed by photo-lithography and then etching.

Figure 5B:
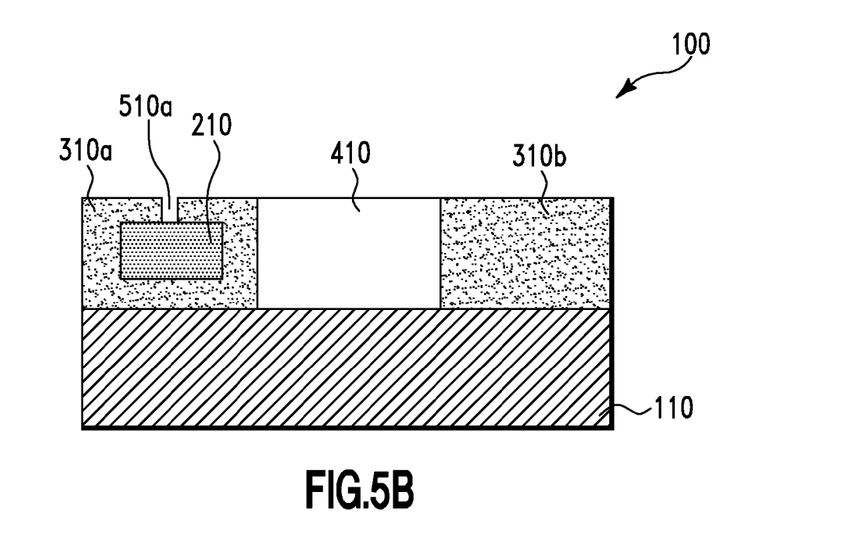

FIG. 5B illustrates a cross-section view of the structure 100 of FIG. 5A along a plane defined by a line 5B. As can be seen in FIG. 5B, the catalyst region 210 is exposed to the surrounding ambient via the hole 510a.

Figure 6A:
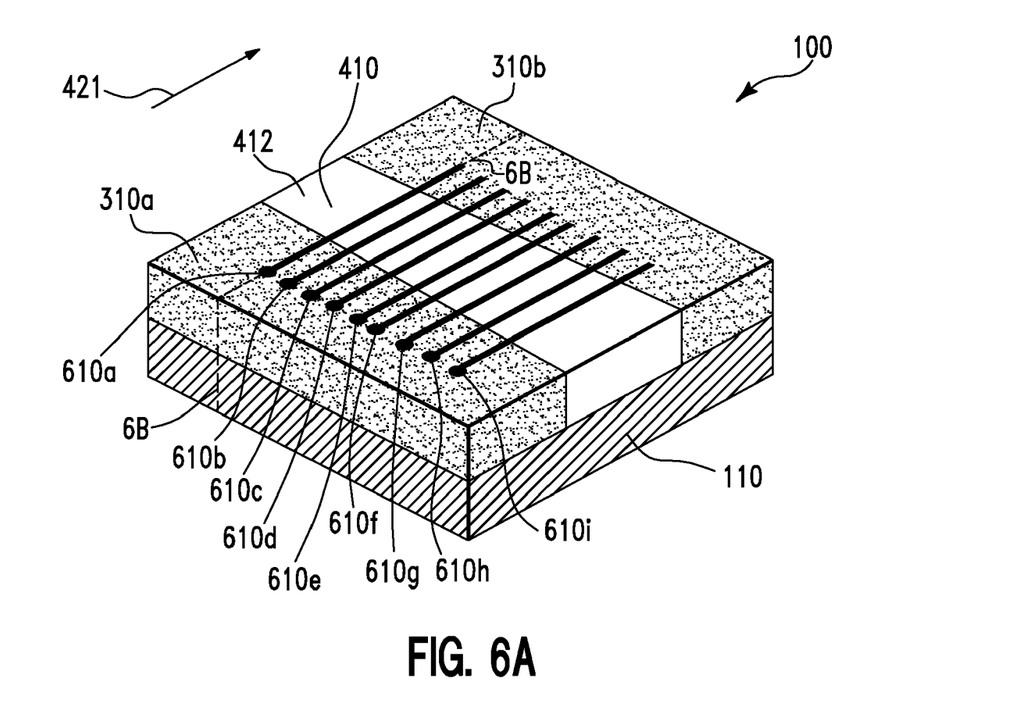

Next, with reference to FIG. 6A, in one embodiment, CNTs (carbon nanotubes) 610a-610i are formed on top of the structure 100 of FIG. 5A. Illustratively, the CNTs 610a-610i are a molecular form of carbon. In one embodiment, the CNTs 610a-610i are formed by placing the structure 100 of FIG. 5A in a plasma environment (not shown) which includes chemicals such as methane or alcohol, at an appropriate temperature (typically 600-900° C.). As a result, CNTs grow up from the catalyst region 210 at bottom of the holes 510a-510i to, and beyond, the top of the holes 510a-510i. At the same time, reactants flow in the direction 421 from the dielectric region 310a to the dielectric region 310b. As a result, CNTs 610a-610i grow in the direction 421 from the dielectric region 310a to the dielectric region 310b across a top surface 412 of the sacrificial layer 410. In one embodiment, the CNTs 610a-610i have the same length, though having the same length is not required.

Figure 6B:
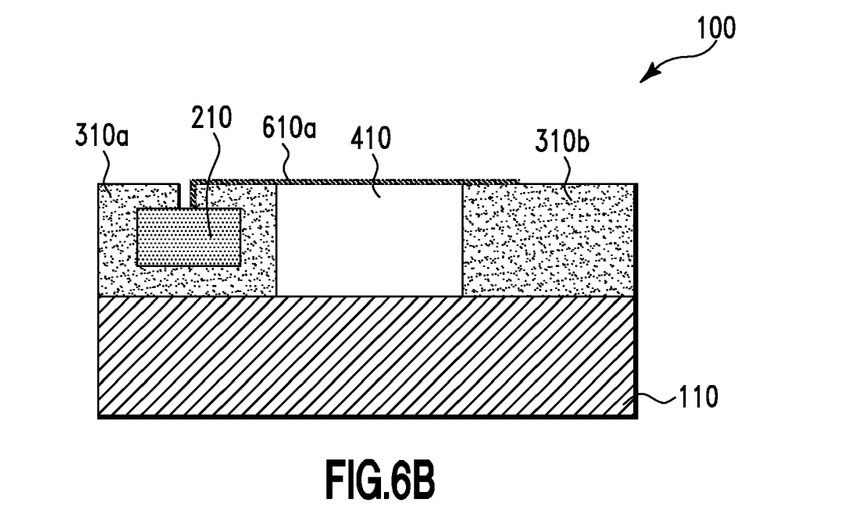

FIG. 6B illustrates a cross-section view of the structure 100 of FIG. 6A along a plane defined by a line 6B.

Figure 6C:
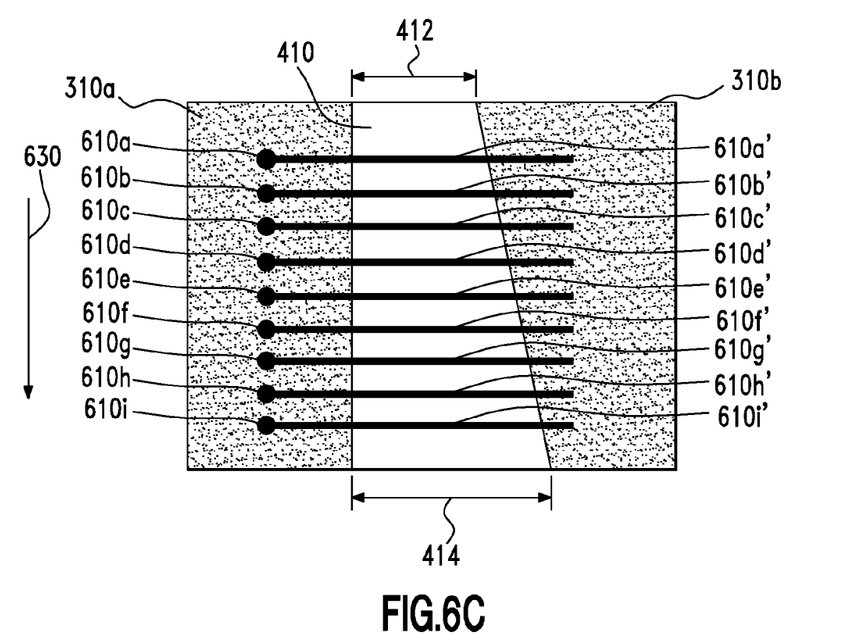

FIG. 6C illustrates a top-down view of the structure 100 of FIG. 6A. In one embodiment, with reference to FIG. 6C, the CNTs 610a-610i have the same length. It should be noted that CNT segments 610a'-610i' of the CNTs 610a-610i which are directly above the sacrificial layer 410 have different lengths. In one embodiment, when going in a direction 630, the lengths of the CNT segments 610a'-610i' increases. For instance, the length of the CNT segment 610a' is shorter than the length of the CNT segment 610b'.

Figure 7A:
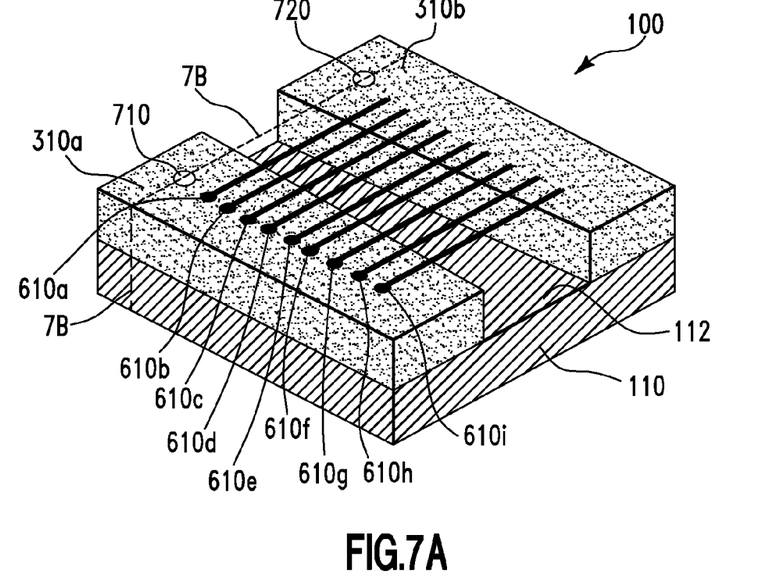

Next, with reference to FIG. 7A, contact holes 710 and 720 are formed in the dielectric regions 310a and 310b, respectively. More specifically, the contact hole 710 is formed in the dielectric region 310a such that the catalyst region 210 is exposed to the surrounding ambient via the contact hole 710. In one embodiment, the contact hole 720 is formed in the dielectric region 310b such that the conductive layer 110 is exposed to the surrounding ambient via the contact hole 720. Illustratively, the contact holes 710 and 720 can be simultaneously formed by photo-lithography and then etching.

Next, in one embodiment, the sacrificial layer 410 (FIG. 6A) is removed to expose the top surface 112 of the conductive layer 110 to the surrounding ambient. Illustratively, the sacrificial layer 410 can be removed by wet etching. It should be noted that after the removal of the sacrificial layer 410, the CNTs 610a-610i hang above without touching the conductive layer 110.

Figure 7B:
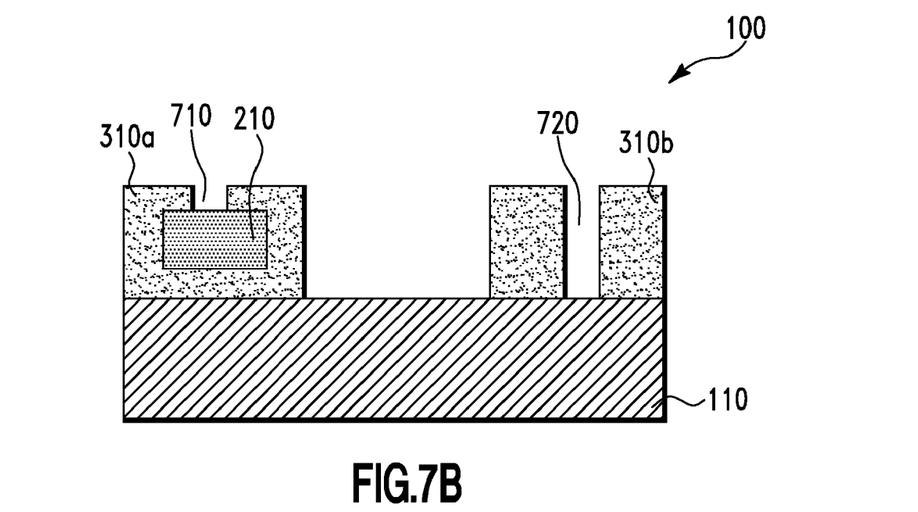

FIG. 7B illustrates a cross-section view of the structure 100 of FIG. 7A along a plane defined by a line 7B. As can be seen in FIG. 7B, the catalyst region 210 is exposed to the surrounding ambient via the contact hole 710 and the conductive layer 110 is exposed to the surrounding ambient via the contact hole 720.

Figure 7C:
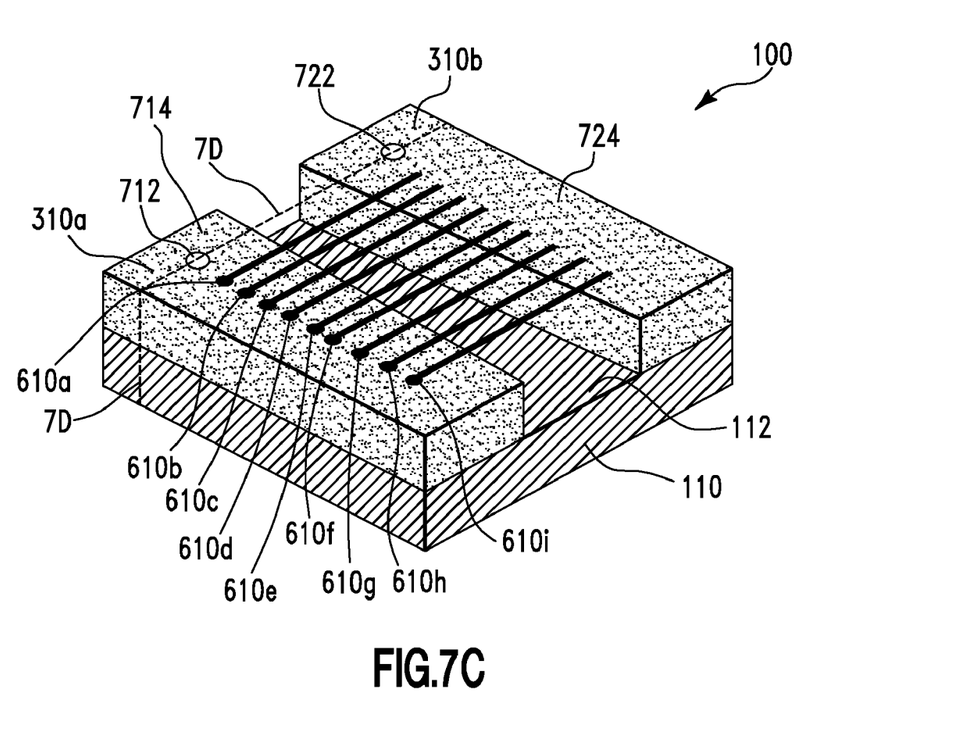

Next, with reference to FIG. 7C, in one embodiment, contact regions 712 and 722 are formed in the contact holes 710 and 720, respectively. Illustratively, the contact regions 712 and 714 can be formed by CVD of tungsten followed by a RIE (reactive ion etching) step until top surfaces 714 and 724 of the dielectric regions 310a and 310b are exposed to the surrounding ambient, respectively. In one embodiment, the contact regions 712 and 724 provide electrical access to the catalyst region 210 and the conductive layer 110, respectively.

Figure 7D:
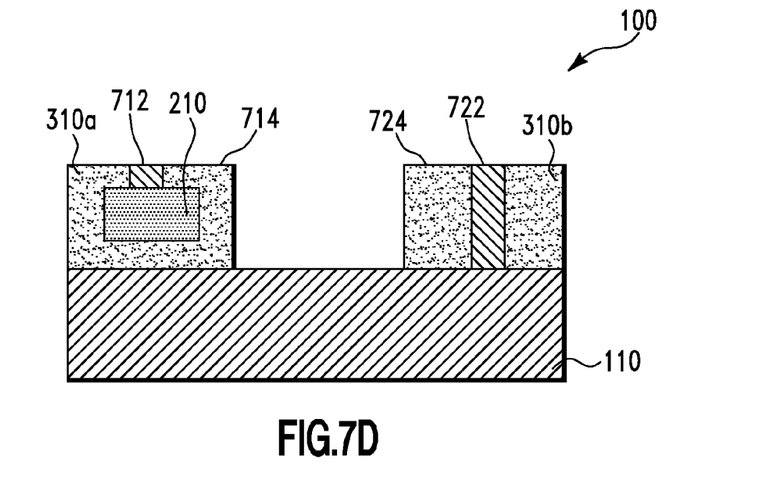

FIG. 7D illustrates a cross-section view of the structure 100 of FIG. 7C along a plane defined by a line 7D.

In summary, the CNTs 610a-610i are electrically connected together via the catalyst region 210, and the CNTs 610a-610i are electrically insulated from the conductive layer 110 by the dielectric regions 310a and 310b. It should be noted that the lengths of the CNT segments 610a'-610i' are different.

In the embodiments described above, the contact regions 712 and 722 are formed after the formation of the CNTs 610a-610i. Alternatively, the contact regions 712 and 722 are formed before the formation of the holes 510a-510i (from where the CNTs 610a-610i are subsequently grown).

In one embodiment, the structure 100 of FIG. 7C is in either a first state or a second state depending on whether the catalyst region 210 is electrically connected to the conductive layer 110. More specifically, the structure 100 of FIG. 7C is in the first state if at least one of the CNTs 610a-610i electrically couples the catalyst region 210 to the conductive layer 110. In contrast, the structure 100 of FIG. 7C is in the second state if none of the CNTs 610a-610i electrically couples the catalyst region 210 to the conductive layer 110.

Figure 8:
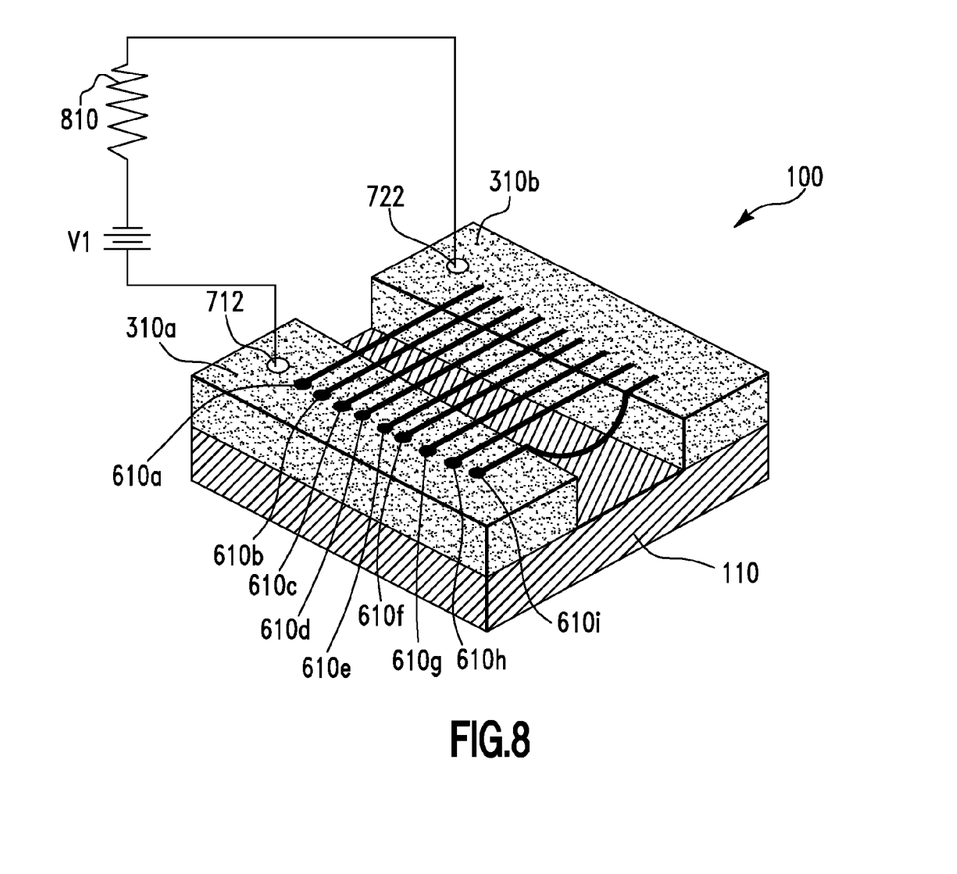
FIGS. 8-10 describe a method for operating of the structure of FIG. 7C, in accordance with embodiments of the present invention.
Figure 9:
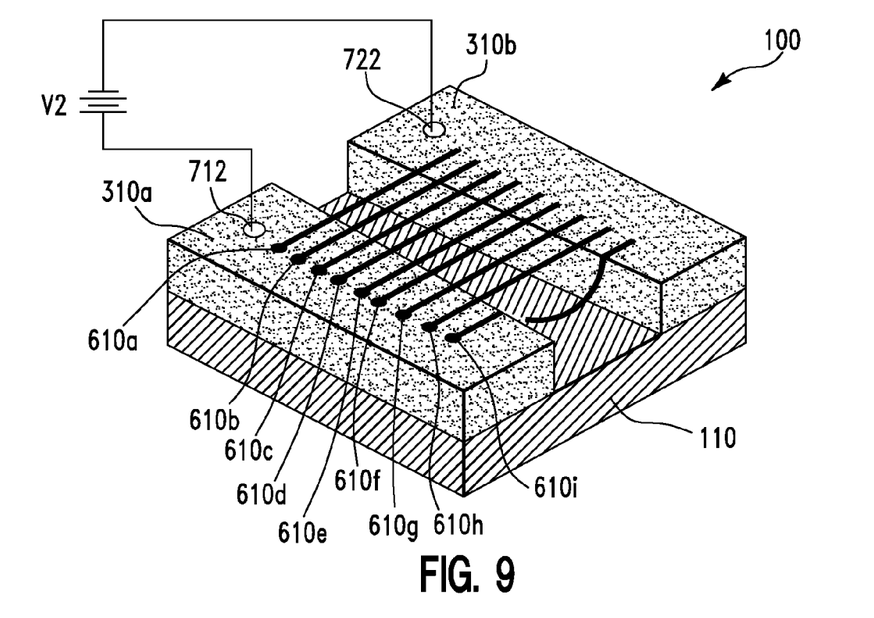
Figure 10:
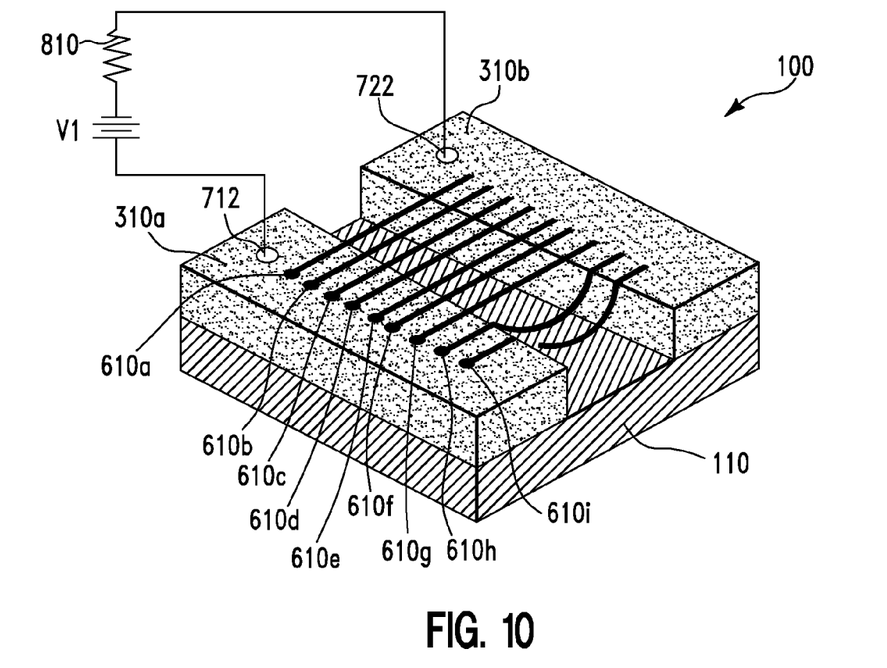

FIGS. 8-10 describe a method of operation of the structure 100 of FIG. 7C, in accordance with embodiments of the present invention.

FIG. 8 illustrates the method for bringing the structure 100 of FIG. 7C from the second state to the first state, in accordance with embodiments of the present invention. More specifically, in one embodiment, a voltage V1 is applied between the catalyst region 210 and the conductive layer 110 via a resistor 810. As a result, between CNTs 610a-610i and the conductive layer 110 appears the voltage V1. This is because the CNTs 610a-610i are electrically connected to the catalyst region 210. As a result of the voltage V1 between the CNTs 610a-610i and the conductive layer 110, the CNTs 610a-610i are attracted towards the conductive layer 110. Because the CNT segment 610i' is the longest among the CNT segments 610a'-610i', the CNT segment 610i' is the first one to touch the conductive layer 110. As soon as the CNT segment 610i' touches the conductive layer 110, the CNTs 610a-610i and the conductive layer 110 have the same voltage. Therefore, the CNT segments 610a'-610h' are no longer pulled toward the conductive layer 110. In one embodiment, the resistor 810 is selected such that the current flowing from catalyst region 210 through the CNT 610i to conductive layer 110 is not high enough to blow (burn through) the CNT 610i after the CNT segment 610i' comes into direct physical contact with the conductive layer 110. After that, in one embodiment, the voltage V1 is removed from the catalyst region 210 and the conductive layer 110. In one embodiment, after the removal of the voltage V1, the CNT 610i remains in direct physical contact with the conductive layer 110. As a result, one of the CNTs 610a-610i electrically couples the catalyst region 210 to the conductive layer 110. In other words, the structure 100 is in the first state.

FIG. 9 illustrates the method for bringing the structure 100 of FIG. 8 from the first state back to the second state, in accordance with embodiments of the present invention. More specifically, in one embodiment, a voltage V2 is applied between the catalyst region 210 and the conductive layer 110. As a result, there is a current flowing from the catalyst region 210 through the CNT 610*i* to the conductive layer 110. In one embodiment, the voltage V2 is high enough such that the resulting current flowing through the CNT 610*i* is strong enough to blow the CNT 610*i* but the voltage V2 is not high enough to cause the remaining CNTs 610*a*-610*h* to touch the conductive layer 110 (after the CNT 610*i* is blown, as can be seen in FIG. 9). After fuse blow, in one embodiment, the voltage V2 is removed from the catalyst region 210 and the conductive layer 110. As a result, none of the CNTs 610*a*-610*i* electrically couples the catalyst region 210 to the conductive layer 110. In other words, the structure 100 switches from the first state to the second state.

FIG. 10 illustrates the method for bringing the structure 100 of FIG. 9 from the second state to the first state after the CNT 610*i* is blown, in accordance with embodiments of the present invention. More specifically, in one embodiment, the voltage V1 is applied between the catalyst region 210 and the conductive layer 110 via the resistor 810. As a result, the CNTs 610*a*-610*h* are attracted towards the conductive layer 110. In one embodiment, the CNT segment 610*h*' touches the conductive layer 110 in a manner similar to the manner the CNT segment 610*i*' touches the conductive layer 110 as described above. In one embodiment, the resistor 810 is selected such that the current flowing through the CNT 610*h* is not high enough to blow the CNT 610*h* after the CNT segment 610*h*' comes into direct physical contact with the conductive layer 110. After that, in one embodiment, the voltage V1 is removed from the catalyst region 210 and the conductive layer 110. In one embodiment, after the removal of the voltage V1, the CNT 610*h* remains in direct physical contact with the conductive layer 110. As a result, one of the CNTs 610*a*-610*i* electrically couples the catalyst region 210 to the conductive layer 110. In other words, the structure 100 switches from the second state to the first state.

In summary, the state of the structure 100 of FIG. 7C can be changed from the second state to the first state by causing a CNT to touch the conductive layer 110. In one embodiment, the state of the structure 100 can be changed from the first state to the second state by blowing the CNT that electrically couples the catalyst region 210 to the conductive layer 110. It should be noted that the state of the structure 100 can be changed from the second state to the first state N times, wherein N is the number of CNTs. In the case of the structure 100 of FIG. 7A, the state of the structure 100 can be changed from the second state to the first state nine times because it has the nine CNTs 610*a*-610*i*. As a result, in one embodiment, the structure 100 of FIG. 7C can be used as a memory cell whose content can be changed eighteen times.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

The invention claimed is:

1. A structure operating method, comprising:
   providing a structure which includes
   (a) an electrically conductive layer,
   (b) a first dielectric region and a second dielectric region on top of the electrically conductive layer,
   (c) N electrically conductive regions resting on the first and second dielectric regions and hanging over without touching the electrically conductive layer,
   wherein N is a positive integer and N is greater than 1,
   wherein the N electrically conductive regions are electrically connected together,
   wherein N electrically conductive region segments of the N electrically conductive regions have different lengths,
   wherein the N electrically conductive region segments are not in direct physical contact with the first and second dielectric regions and the electrically conductive layer; and
   causing a first electrically conductive region segment of the N electrically conductive region segments to touch the electrically conductive layer without causing the remaining N−1 electrically conductive region segments to touch the electrically conductive layer,
   wherein the first electrically conductive region segment is the longest electrically conductive region segment of the N electrically conductive region segments.

2. The method of claim 1, wherein the N electrically conductive regions are N CNTs (carbon nanotubes).

3. The method of claim 1, wherein said causing the first electrically conductive region segment of the N electrically conductive region segments to touch the electrically conductive layer comprises applying a first voltage between the electrically conductive layer and the N electrically conductive region segments,
   wherein the first voltage is high enough to cause the first electrically conductive region segment of the N electrically conductive region segments to touch the electrically conductive layer.

4. The method of claim 1, wherein the electrically conductive layer comprises an electrically conductive material selected from the group consisting of copper, aluminum, and tungsten.

5. The method of claim 1, wherein the first and second dielectric regions comprise silicon dioxide.

6. The method of claim 1,
   wherein the structure further includes a catalyst region buried inside the first dielectric region, and
   wherein the N electrically conductive regions are electrically coupled to the catalyst region.

7. The method of claim 6, wherein the structure further includes
   (i) a first contact region,
      wherein the first contact region is in the first dielectric region and in direct physical contact with the catalyst region; and
   (ii) a second contact region,
      wherein the second contact region is in the second dielectric region and in direct physical contact with the electrically conductive layer.

8. The method of claim 1, further comprising after said causing the first electrically conductive region segment of the N electrically conductive region segments to touch the electrically conductive layer, electrically disconnecting the electrically conductive layer from the remaining N−1 electrically conductive regions.

9. The method of claim 8, wherein said electrically disconnecting the electrically conductive layer from the remaining N−1 electrically conductive regions comprises blowing the first electrically conductive region segment.

10. The method of claim 9, wherein said blowing the first electrically conductive region segment comprises applying a second voltage between the electrically conductive layer and the N electrically conductive region segments resulting in the first electrically conductive region segment being blown, wherein the second voltage is not high enough to cause any of the remaining N−1 electrically conductive regions to touch the electrically conductive layer after the first electrically conductive region segment is blown.

11. The method of claim 9, further comprising after said blowing the first electrically conductive region segment, again applying the first voltage between the electrically conductive layer and the N electrically conductive region segments to cause a second electrically conductive region segment of the remaining N−1 electrically conductive region segments to touch the electrically conductive layer, wherein the second electrically conductive region segment is the longest electrically conductive region segment of the remaining N−1 electrically conductive region segments.

12. A structure operating method, comprising:
providing a structure which includes
(a) an electrically conductive layer,
(b) N electrically conductive regions hanging over without touching the electrically conductive layer,
wherein N is a positive integer and N is greater than 1,
wherein the N electrically conductive regions are electrically connected together; and
causing a first electrically conductive region of the N electrically conductive regions to touch the electrically conductive layer without causing the remaining N−1 electrically conductive regions to touch the electrically conductive layer.

13. The method of claim 12, wherein the N electrically conductive regions are N CNTs (carbon nanotubes).

14. The method of claim 12, wherein said causing the first electrically conductive region of the N electrically conductive regions to touch the electrically conductive layer comprises applying a first voltage between the electrically conductive layer and the N electrically conductive regions, wherein the first voltage is high enough to cause the first electrically conductive region of the N electrically conductive regions to touch the electrically conductive layer.

15. The method of claim 14, wherein said applying the first voltage comprises applying two electrodes of a voltage source to the electrically conductive layer and the N electrically conductive regions via a resistor in series with the voltage source such that when the first electrically conductive region touches the electrically conductive layer, a resulting current flowing through the first electrically conductive region does not blow the first electrically conductive region.

16. The method of claim 12,
wherein the structure further includes a catalyst region, and
wherein the N electrically conductive regions are electrically coupled to the catalyst region.

17. The method of claim 12, further comprising after said causing the first electrically conductive region of the N electrically conductive regions to touch the electrically conductive layer, electrically disconnecting the electrically conductive layer from the remaining N−1 electrically conductive regions.

18. The method of claim 17, wherein said electrically disconnecting the electrically conductive layer from the remaining N−1 electrically conductive regions comprises blowing the first electrically conductive region.

19. The method of claim 17, wherein said blowing the first electrically conductive region comprises applying a second voltage between the electrically conductive layer and the N electrically conductive region resulting in the first electrically conductive region being blown, wherein the second voltage is not high enough to cause the remaining N−1 electrically conductive regions to touch the electrically conductive layer after the first electrically conductive region segment is blown.

20. The method of claim 18, further comprising after said blowing the first electrically conductive region segment, again applying the first voltage between the electrically conductive layer and the N electrically conductive region to cause a second electrically conductive region segment of the remaining N−1 electrically conductive regions to touch the electrically conductive layer.

* * * * *